United States Patent [19]

Saito et al.

[11] Patent Number: 4,748,597

[45] Date of Patent: May 31, 1988

[54] SEMICONDUCTOR MEMORY DEVICE WITH REDUNDANCY CIRCUITS

[75] Inventors: Shozo Saito, Yokohama; Syuso Fujii, Kawasaki, both of Japan

[73] Assignee: Kabushiki Kaisha Toshiba, Kawasaki, Japan

[21] Appl. No.: 907,966

[22] Filed: Sep. 16, 1986

[30] Foreign Application Priority Data

Sep. 18, 1985 [JP] Japan ................... 60-205747

[51] Int. Cl.[4] ................... G11C 7/00; G11C 8/00
[52] U.S. Cl. ................... 365/230; 365/189; 365/200; 307/449
[58] Field of Search ........... 365/200, 189, 96, 230; 307/445, 449

[56] References Cited

U.S. PATENT DOCUMENTS

| | | | |
|---|---|---|---|
| 4,047,163 | 9/1977 | Choate et al. | 365/200 X |
| 4,358,833 | 11/1982 | Folmsbee et al. | 365/200 |
| 4,538,245 | 8/1985 | Smarandoiu et al. | 365/200 |
| 4,573,146 | 2/1986 | Graham et al. | 365/200 |
| 4,577,294 | 3/1986 | Brown et al. | 365/200 |
| 4,606,013 | 8/1986 | Yoshimoto | 365/200 |
| 4,654,830 | 3/1987 | Chua et al. | 365/200 |
| 4,658,379 | 4/1987 | Fujishima et al. | 365/200 |

OTHER PUBLICATIONS

Canker et al., "A Fault-Tolerant 64K Dynamic RAM," IEEE International Solid-State Circuits Conference, ISCC, pp. 150-151 and 290, Feb. 15, 1979.

*Primary Examiner*—Stuart N. Hecker
*Assistant Examiner*—Alyssa H. Bowler
*Attorney, Agent, or Firm*—Finnegan, Henderson, Farabow, Garrett and Dunner

[57] ABSTRACT

Address signals are decoded by partial decoders, to generate in-phase and complementary signals. These signals are selectively input to main decoders consisting of NAND circuits. Further, these signals are fed via through programming fuse elements to a NOR gate. The fuse elements and the NOR gate form a programmable spare decoder. When the bit selected by the main decoder is defective, the output of this main decoder is shut off. Further, the fuse element of the spare decoder is opened corresponding to the main decoder to select the defective bit, thereby to replace the defective bit with the spare bit.

6 Claims, 3 Drawing Sheets

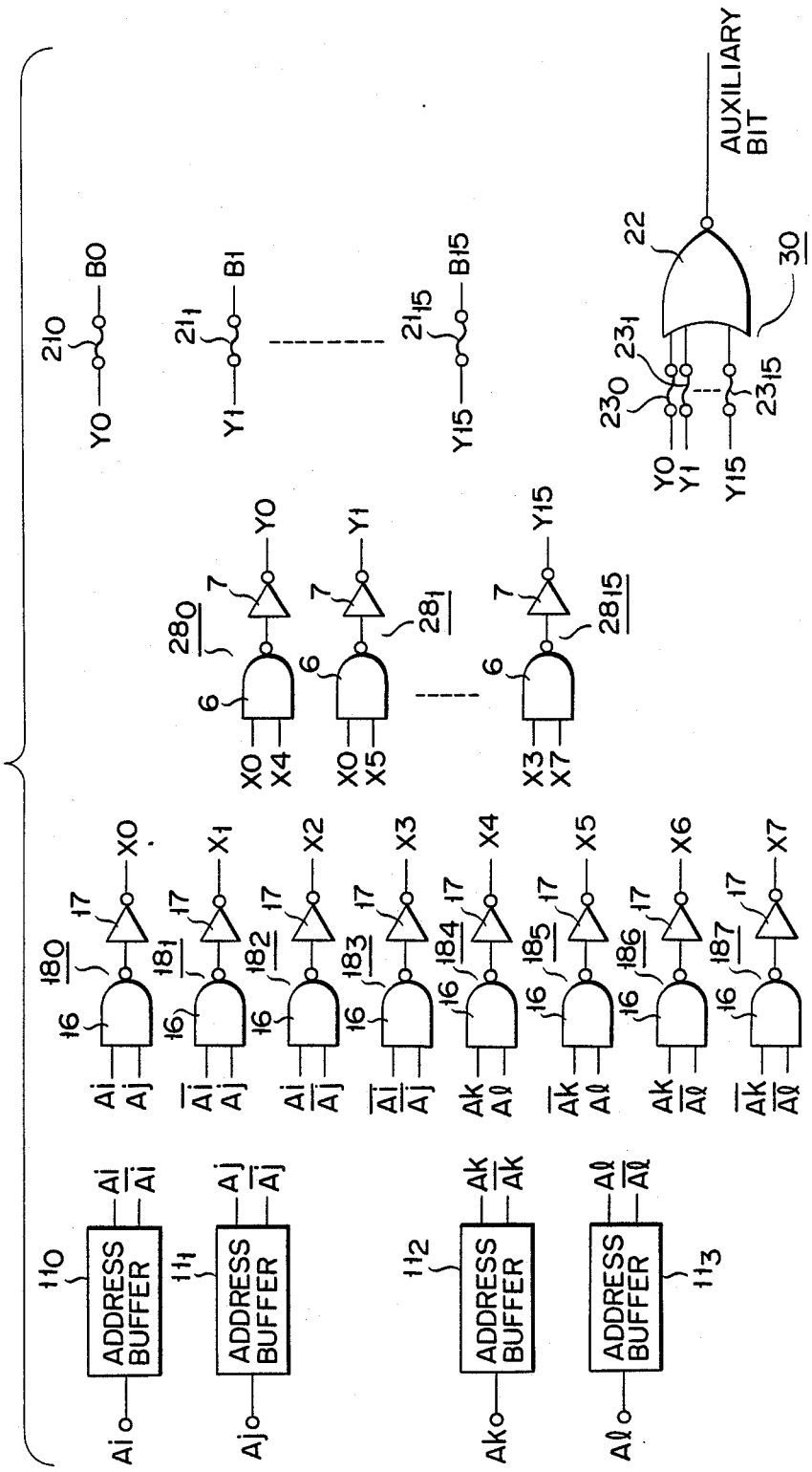
F I G. 3

SEMICONDUCTOR MEMORY DEVICE WITH REDUNDANCY CIRCUITS

BACKGROUND OF THE INVENTION

This invention relates to semiconductor memory devices with redundancy circuits, and more particularly to an improvement of programmable spare decoders in semiconductor memory devices.

In recent years, in semiconductor devices of a very high degree of integration, called "VLSI" (very large scale integration), with increase of integration density, the miniaturization of elements and the size increase of chips have been amazing. For this reason, the probability of a defective bit occurring in a semiconductor chip has become greater and a reduction of the manufacturing yield has occurred. In order to solve this problem, auxiliary decoders and spare bits are formed in the chip. Semiconductor integrated circuit devices have been developed in which, is defective bit, it is replaced with a spare bit by means of an auxiliary decoder. These circuits are called "redundancy circuits." In order to replace the defective bit with a spare bit, the auxiliary decoder can be programmed so that the defective bit is disconnected from the device by a programmable fuse element, and the spare bit selected.

FIG. 1 shows a buffer circuit, a main decoder circuit and a programmable spare decoder circuit in a MOS (metal oxide semiconductor) dynamic RAM (random access memory). Address buffers $11_0$, $11_1$, $11_2$, $11_3$ are provided to receive address inputs Ai, Aj, Ak and Al. Each of the address buffers $11_0$ to $11_3$ outputs two signals, one in phase with its input signal, and the other out of phase, i.e. a complementary signal. Main decoders are composed of NOR circuits $12_0$ to $12_{15}$, which receive different combinations of two signals output from buffers $11_0$ to $11_3$.

One of the decoders $12_0$ to $12_{15}$ is energized according to the logic of the address input, and the energized decoder energizes that one of the bit lines $B_0$ to $B_{15}$ which is connected to the energized decoder. For example, if a defective bit is detected in the bit line $B_0$ connected to decoder $12_0$ according to a known method, fuse $13_0$ between decoder $12_0$ and bit line $B_0$ is opened or burned according to a relevant known method to disconnect decoder $12_0$ from the memory. The spare decoder 10 is comprised of fuses $15_0$ to $15_7$ coupled with all outputs Ai, $\overline{Ai}$ to Al, $\overline{Al}$ of address buffers $11_0$ to $11_3$ and a NOR circuit 14 coupled with those fuses. Spare decoder 10 designates an auxiliary or spare bit to repair the defective bit. To designate the auxiliary bit, it is necessary to program spare decoder 10 so that the logic of the spare decoder 10 will be equal to that of the main decoder connected to the defective bit. This can be attained by selectively opening fuses $15_0$ to $15_7$ so as to have the same program. In this case, the number of fuses to be opened is the half of the buffer outputs Ai, $\overline{Ai}$ to Al, $\overline{Al}$.

In recent years, a laser has been used for opening or burning these fuse elements. When a laser is used, the accuracy of the opening operation is relatively improved, but is still insufficient. The number of opening errors increases as the number of fuses to be opened increases. Therefore, a decrease in the number of burned fuses leads to improvement of repairing accuracy of defective elements.

The main decoders $12_0$ to $12_{15}$ used in the conventional MOS dynamic RAM are constructed with NOR circuits. In all of these NOR circuits, in a precharge mode, their output nodes are precharged to logical high level. In an active mode, nodes other than a selected node are discharged to logical low level. The discharge of the non-select nodes consumes much power. Reduction of the power dissipation is a strong demand in this field.

SUMMARY OF THE INVENTION

Accordingly, an object of this invention is to provide a semiconductor device which can effectively repair defective bits with low power dissipation by reducing the number of fuse elements.

According to an aspect of this invention, there is provided a semiconductor memory device comprising:

address buffers each receiving an address signal and producing a signal in phase with the address signal and a signal out of phase with the address signal;

partial decoders comprising NAND gates for receiving different combinations of the signals supplied from said address buffers and producing output signals;

main decoders comprising NAND gates for receiving different combinations of the signals supplied from said partial decoders and producing output signals to select a bit designated by the address signal; and a programmable decoder comprising programming fuse elements connected to the output signals from the partial decoders and a NOR gate connected to the signals from the fuse elements.

According to another aspect of this invention, there is provided a semiconductor memory device comprising:

address buffers each receiving an address signal and producing a signal in phase with the address signal and a signal out of phase with the address signal;

first partial decoders comprising NAND gates for receiving different combinations of the signals supplied from said address buffers and producing output signals;

second partial decoders comprising NAND gates for receiving different combinations of the signals supplied from said first partial decoders and producing output signals;

main decoders comprising fuse elements for receiving the signals supplied from said second partial decoders and producing output signals to select a bit designated by the address signal; and a programmable decoder comprising programming fuse elements connected to the output signals from said second partial decoders and a NOR gate connected to the signals from the fuse elements.

According to a further aspect of this invention, there is provided a semiconductor memory device comprising:

address buffers each receiving an address signal and producing a signal in phase with the address signal and a signal out of phase with the address signal;

a plurality of stages of partial decoders, partial decoders of the first stage comprising NAND gate for receiving different combinations of the signals supplied from said address buffers and producing output signals, the partial decoders of the second and the following stages each comprising NAND gates for receiving different combinations of the signals supplied from the partial decoders of the preceding stage and producing output signals to the partial decoders of the following stage;

main decoders comprising fuse elements for receiving the signals supplied from the partial decoders of the final stage and producing output signals to select a bit designated by the address signal; and a programmable decoder comprising programming fuse elements connected to the output signals from said partial decoders of the final stage and a NOR gate connected to the signals from the fuse elements.

BRIEF DESCRIPTION OF THE DRAWINGS

FIG. 3 is a logic circuit diagram of a semiconductor device according to another embodiment of this invention.

DETAILED DESCRIPTION OF THE PREFERRED EMBODIMENTS

Figure 2:
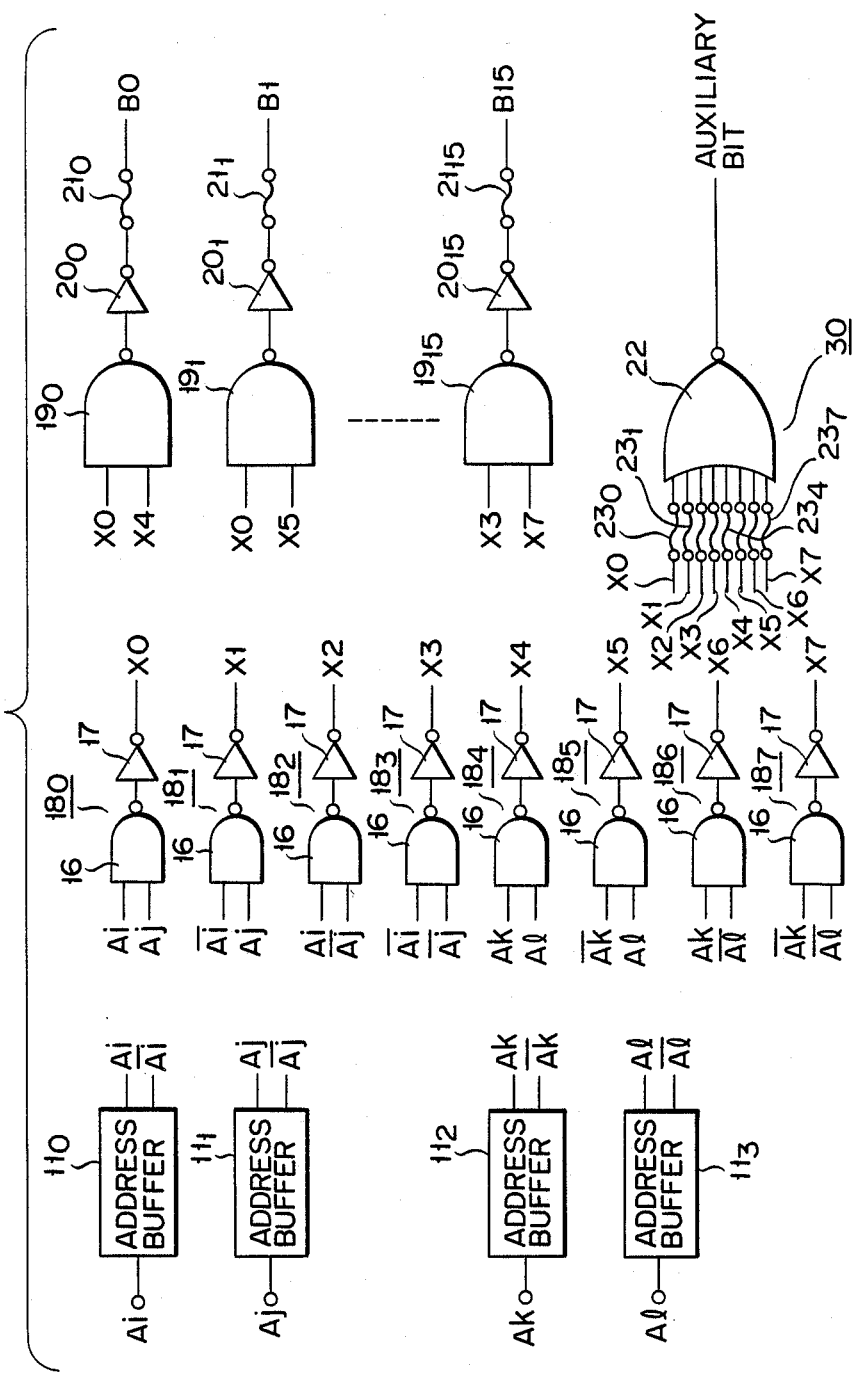
FIG. 2 is a logic circuit diagram of a semiconductor device according to an embodiment of this invention.

An embodiment of this invention will be described referring to FIG. 2. In this embodiment, only four address inputs Ai, Aj, Ak and Al are provided for simplicity of explanation. Four address buffers $11_0$ to $11_3$ are provided for receiving address inputs Ai, Aj, Ak and Al, respectively. These buffers output signals that are in phase with their inputs and signals that are out of phase, i.e., complementary signals. Partial decoders $18_0$ to $18_7$ are each composed of a NAND circuit 16 and an inverter 17 connected to the output of the NAND circuit. Different paired signals or different combinations of signals output from buffers $11_0$ to $11_3$ are supplied to these NAND circuits as the input signals. Different paired signals of outputs X0–X7 of partial decoders $18_0$ to $18_7$ are input to main decoders $19_0$ to $19_{15}$, which are composed of NAND circuits. For example, if a defective bit is detected in the bit line B0 connected to decoder $19_0$ according to a known method, fuse $21_0$ between decoder $19_0$ and bit line B0 is opened or burned according to the relevant known method to disconnect decoder $19_0$ from the memory. The spare decoder 30 is comprised of programming fuses $23_0$ to $23_7$ coupled with all outputs of the partial decoders $18_0$ to $18_7$ coupled with those fuses. Spare decoder 30 designates an auxiliary or spare bit to repair the defective bit. To designate the auxiliary bit, it is necessary to program spare decoder 30 so that the logic of the spare decoder 30 is equal to that of the main decoder connected to the defective bit. This can be attained by opening only two fuses $23_0$ and $23_4$ of those $23_0$ to $23_7$. The fuses $23_0$ and $23_4$ are coupled with signals, which are input to NAND circuit $19_0$ as the main decoder. Thus, opening of only two fuses of those eight fuses is needed for programming in this embodiment, while the prior art needs the opening of the half of all fuses. That is to say, the number of opened fuses may be reduced ½ of that of the prior art. In this respect, the opening error occurrence is remarkably reduced in this embodiment.

NAND circuits are used for the main decoders $19_0$ to $19_{15}$. Therefore, in the active mode, only the output node of the selected decoder or the bit line connected to the selected decoder is discharged. The output nodes of the remaining decoders are left in the precharged state, i.e., logical high level. As a result, the power dissipation can be reduced.

In the decoder of this embodiment, although the number of required fuses is equal to that of the prior decoder, the number of opened fuse elements is reduced half. In this respect, repair of defective bits by the redundancy circuit can greatly be improved.

Alternatively, second partial decoders are used, which are connected to the outputs of the partial decoders $18_0$–$18_7$. The outputs of the second partial decoders are supplied to spare decoder 30 via programming fuses $23_0$ to $23_3$ of spare decoder 30. Such an approach is implemented in FIG. 3. In FIG. 3, same reference numerals are used for designating same equivalent portions in FIG. 2. As shown, in this embodiment, second partial decoders $28_0$ to $28_{15}$ each comprising a NAND gate 6 and an inverter 7 are provided. Applied to second partial decoders $28_0$ to $28_{15}$ are different pairs of outputs X0 to X7 issued from the first partial decoders $18_0$–$18_7$. The outputs Y0 to Y15 of second decoders $28_0$ to $28_{15}$ are input to spare decoder 30 via programming fuses $23_0$ to $23_{15}$.

For example, if a defective bit is detected in the bit line B0 connected to fuse $21_0$ as a main decoder according to the known method, fuse $21_0$ connected to bit line B0 is opened according to a relevant known method to disconnect the output Y0 from the memory. The spare decoder 30 is comprised of fuses $23_0$ to $23_{15}$ coupled with all outputs Y0–Y15 of the second partial decoders $28_0$ to $28_{15}$, and a NOR circuit 22 coupled with those fuses. Spare decoder 30 designates an auxiliary or spare bit to repair the defective bit. To designate the auxiliary bit, it is necessary to program spare decoder 30 so that the logic of the spare decoder 30 be equal to that of the main decoder connected to the defective bit. This can be attained by opening only one fuse $23_0$ of those $23_0$ to $23_{15}$. The fuse $23_0$ is coupled with the signal Y0, which is input to the fuse $21_0$ as the main decoder. Thus, in this embodiment, the opening of the one fuse is needed for programming, while the prior art needs the opening of half of all the fuses. That is to say, the number of open fuses may be reduced ¼ of that of the prior art. In this respect, the opening error occurrence is remarkable reduced in this embodiment.

As described above, in this embodiment, no NAND circuits are used for the main decoders. Therefore, the charge or discharge does not occur. As the result, the power dissipation can be reduced.

Figure 1:
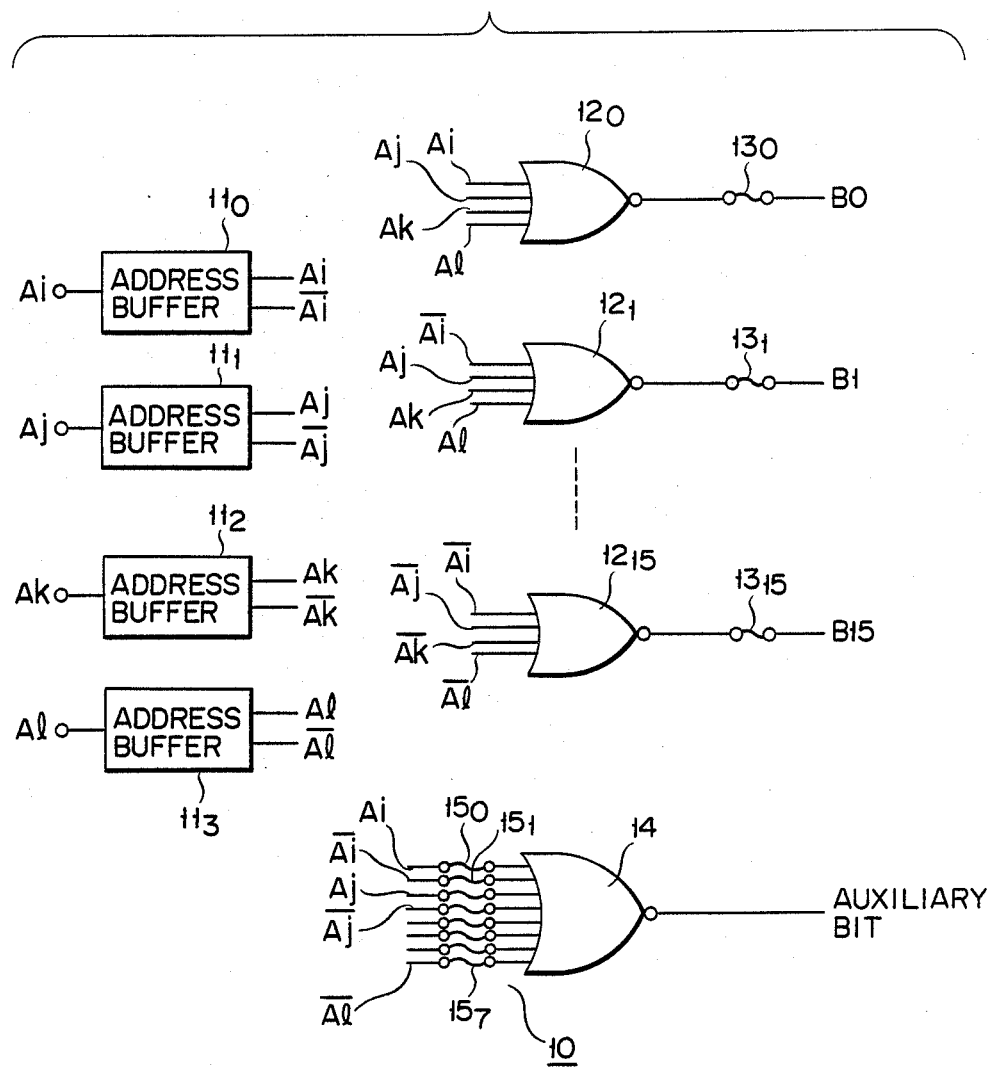
FIG. 1 is a logic circuit diagram showing one example of prior semiconductor devices.

It should be understood that the number of partial decoder stages is not limited to one or two stages, but if necessary a desired number of the decoder stages may be used. The number of fuses to be opened is reduced $\frac{1}{2^n}$ that of the prior device shown in FIG. 1 (n is the number of stages of partial decoder).

As will clearly be understood form the above, according to the invention, the production yield can be increased and the power dissipation can be reduced.

What is claimed is:

1. A semiconductor memory device comprising:
   address buffer means for receiving a plurality of address inputs and producing a plurality of first outputs having logic levels corresponding to said address inputs and a plurality of second outputs having logic levels complementary to said address inputs;
   partial decoder means including a plurality of NAND gates, each of said NAND gates receiving one each of said first and second outputs of said address buffer means, with each NAND gate receiving a combination of said first and second outputs different from the combination received by each of the other NAND gates and wherein each NAND gate of said partial decoder means produces an output;

main decoder means including a plurality of NAND gates, each NAND gate receiving a predetermined combination of outputs of said partial decoder means, said combination of outputs being different from the outputs received by each of the other NAND gates of said main decoder means and producing an output to select a bit designated by said address signal; and programmable decoder means including a plurality of fuse elements and a NOR gate, the NOR gate receiving the outputs of said partial decoder means via said fuse elements at times when a designated address bit from said main decoder means is defective and said main decoder means is disconnected, to select a spare bit.

2. A semiconductor memory device according to claim 1, in which said programmable decoder means is programmed with the same program as the main decoder means by opening said fuse elements, to thereby select said spare bit when a designated address bit is defective and said main decoder means is shut off.

3. A semiconductor memory device comprising:

address buffer means for receiving a plurality of address inputs and producing a plurality of first outputs whose logic levels are the same as those of said address inputs and a plurality of second outputs whose logic levels are complementary to those of said address inputs;

a first partial decoder means comprising a plurality of NAND gates with each NAND gate receiving a combination of one each of said first and second outputs of said address buffer means, each said NAND gate receiving a combination different from that received by each of the other said NAND gates and producing an output;

a second partial decoder means including a plurality of NAND gates, with each NAND gate receiving two of the outputs of said first partial decoder means whose combination is different from that received by each of the other NAND gates of said second partial decoder and producing an output to select a bit designated by said address signal;

main decoder means comprising a plurality of fuse elements for receiving the outputs of said second partial decoder means and producing outputs to select a bit designated by said address signal; and programmable decoder means comprising a plurality of fuse elements and a NOR gate, the NOR gate receiving the outputs of said second partial decoder means via the fuse elements when a designated address bit is defective and said main decoder means is shut off, to select a spare bit.

4. A semiconductor memory device according to claim 3, in which said programmable decoder means is programmed to have the same program as that of the main decoder means by opening said fuse elements, to thereby select said spare bit when a designated address bit is defective and said main decoder means is shut off.

5. A semiconductor memory device comprising:

address buffer means for receiving a plurality of address inputs and producing a plurality of first outputs whose logic levels are the same as those of said address inputs and a plurality of second outputs whose logic levels are complementary to those of said address inputs;

a plurality of stages of partial decoder means, partial decoder means of the first stage comprising a plurality of NAND gates, each NAND gate receiving a combination of one each of the first and second outputs of said address buffer means which combination is different from that received by each of the other NAND gates and producing an output, the partial decoder means of the remaining stages each including a plurality of NAND gates, each NAND gate of the partial decoder means of each stage receiving two of the outputs of the partial decoder means of a preceeding stage whose combination is different from that of two outputs received by each of the other NAND gates and producing an output;

main decoder means comprising a plurality of fuse elements for receiving the outputs of the partial decoder means of the final stage and producing outputs to select a bit designated by said address signal; and programmable decoder means comprising a plurality of fuse elements and a NOR gate, the NOR gate receiving the outputs of said partial decoder means of the final stage via the fuse elements when a designated address bit is defective and said main decoder means is shut off, to select a spare bit.

6. A semiconductor memory device according to claim 5, in which said programmable decoder means is programmed by opening said fuse elements to have the same program as that of the main decoder means, to thereby select said spare bit when a designated address bit is defective and said main decoder means is shut off.

* * * * *